(12) United States Patent
Nien et al.

(10) Patent No.: US 8,314,631 B2
(45) Date of Patent: Nov. 20, 2012

(54) TESTING SYSTEM AND TESTING METHOD

(75) Inventors: Kuo-Chiang Nien, Hsinchu (TW);
Li-Cheng Shen, Hsinchu (TW);
Chin-Lien Hsu, Hsinchu (TW);
Tsung-Ying Hsieh, Hsinchu (TW)

(73) Assignee: Quanta Computer, Inc., Kuei Shan Hsiang, Tao Yuan Shien (TW)

( * ) Notice: Subject to any disclaimer, the term of this patent is extended or adjusted under 35 U.S.C. 154(b) by 467 days.

(21) Appl. No.: 12/609,064

(22) Filed: Oct. 30, 2009

(65) Prior Publication Data

US 2010/0207638 A1    Aug. 19, 2010

(30) Foreign Application Priority Data

Feb. 17, 2009    (TW) ................ 98105000 A

(51) Int. Cl.
*G01R 31/26*    (2006.01)
*G01R 31/00*    (2006.01)

(52) U.S. Cl. .......... 324/762.01; 324/750.26; 324/750.27

(58) Field of Classification Search .. 324/762.01–762.1, 324/760.01–760.02, 761.01, 756.01–756.07, 324/755.01–755.11, 754.01–754.3; 257/48; 438/14–18

See application file for complete search history.

(56) References Cited

U.S. PATENT DOCUMENTS 5,828,224 A * 10/1998 Maruyama ............... 324/756.02
6,104,204 A *  8/2000 Hayama et al. .......... 324/750.08

FOREIGN PATENT DOCUMENTS

| TW | 200605771 | 2/2006 |
|----|-----------|--------|
| TW | 200613748 | 5/2006 |
| TW | 200846685 | 12/2008 |
| TW | M347814   | 12/2008 |
| TW | 200908023 | 2/2009 |

OTHER PUBLICATIONS

Taiwanese language office action dated Sep. 5, 2012.
English language translation of abstract of TW 200605771 (published Feb. 1, 2006).
English language translation of abstract of TW 200613748 (published May 1, 2006).
English language translation of abstract of TW 200846685 (published Dec. 1, 2008).
English language translation of abstract of TW M347814 (published Dec. 21, 2008).
English language translation of abstract of TW 200908023 (published Feb. 16, 2009).

* cited by examiner

*Primary Examiner* — Tung X Nguyen
(74) *Attorney, Agent, or Firm* — Thomas|Kayden

(57) ABSTRACT

The invention discloses a testing system and a testing method. The testing system includes a testing platform and a fetching device. The testing platform includes a metal base plate, a DUT board, a testing stand and a metal wall. The DUT board is disposed on the metal base plate. The testing stand is disposed on the DUT board. The metal wall is disposed on the metal base plate and surrounds the testing stand. The fetching device is movably disposed above the testing platform and used for placing a DUT on the testing stand. A metal covering plate of the fetching device corresponds to the metal wall of the testing platform. When the fetching device places the DUT on the testing stand, the metal covering plate cooperates with the metal wall and the metal base plate of the testing platform to form an isolated space, so as to isolate the DUT.

18 Claims, 3 Drawing Sheets

TESTING SYSTEM AND TESTING METHOD

CROSS-REFERENCE TO RELATED APPLICATION

This utility application claims priority to Taiwan Application Serial Number 098105000 filed Feb. 17, 2009, which is incorporated herein by reference.

BACKGROUND OF THE INVENTION

1. Field of the Invention

The invention relates to a testing system and a testing method, and more particularly, to a testing system and a testing method with electromagnetic shielding utility.

2. Description of the Prior Art

With the rocketing development of the semiconductor technology, the four steps of designing, manufacturing, packeting and testing in producing an IC component are now individual professional subjects. With more complex structures, more functionalities and more demanding of preciseness, the testing skill of the IC circuit becomes a critical and necessary technic in ensuring the yield rate and speeding up the producing procedures.

In prior art, for maintaining high efficiency and stabilization in the IC testing, it requires some specific testing instruments for holding the IC under test, measuring signals and avoiding outer noises. There are many micro-sized ICs appeared in many applications, which the compact ICs usually have high electromagnetic sensitivity and tend to be affected by surrounding electromagnetic signals. Especially in the wireless radio application, e.g. radio frequency identification (RFID), the radio frequency integrated circuit (RFIC) is easy to be interfered by other electronic devices around, such that it spoils the measurement and even threaten the safety of the testing operator.

To block the outer electromagnetic interference, a larger metal isolating box is utilized in prior art for covering the whole testing instrument set (usually including testing platform, mechanic arm, signal measuring device or signal wiring). It blocks the unwanted electromagnetic interference from the IC under test by the metal shielding effect of the isolating box, therefore to strength the stability within the testing procedure.

However, the metal isolating box is costly and huge in size. Besides, for example, the isolating box is sealed by utilizing a pneumatic tool. In the testing procedure, after the mechanic arm places the device under test (DUT) on the testing region, it needs to activate the pneumatic tool of the isolating box and then wait until the isolating box is completely concealed, before further signal testing. It makes the testing procedure of the IC component in prior art time-consuming and inefficient.

The invention discloses a testing system and a testing method capable of efficiently completing electromagnetic isolation, so as to solve aforesaid problems.

SUMMARY OF THE INVENTION

A scope of the invention is to provide a testing system, which includes a testing platform and a fetching device.

According to an embodiment of the invention, the testing platform includes a metal base plate, a DUT board, a testing stand and a metal wall. The DUT board is disposed on the metal base plate. The testing stand, disposed on the DUT board, is electrically connected to the DUT board. The metal wall, disposed on the metal base plate, surrounds the testing stand. In a case, the testing stand may include a socket, or in another case, the testing stand can be an anisotropic conductive film.

The fetching device can be movably disposed above the testing platform. The fetching device includes a metal covering plate. The fetching is used for placing a DUT (can be an IC component or an IC module) on the testing stand. In this embodiment, the metal covering plate corresponds to the metal wall of the testing platform (e.g. corresponding in size, shape, depth, etc). When the fetching device places the DUT on the testing stand, the metal covering plate cooperates with the metal wall and the metal base plate of the testing platform to form an isolated space. It utilizes the electromagnetic shielding characteristic of metal material for isolating the DUT.

Another scope of the invention is to provide a testing method, which is suitably applied in a testing system including a testing platform and a fetching device. The testing method includes steps of: (a) proving a DUT; (b) driving the fetching device for placing the DUT onto the testing platform; (c) driving the fetching device to cooperate with the testing platform for forming an isolated space around the DUT; and (d) testing the isolated DUT.

Another scope of the invention is to provide a testing system, which includes a testing platform and a fetching device.

According to an embodiment of the invention, the testing platform includes a first electromagnetic shielding plate, a DUT board, a testing stand and a second electromagnetic shielding plate. The DUT board is disposed on the first electromagnetic shielding plate. The testing stand, disposed on the DUT board, is electrically connected to the DUT board. The second electromagnetic shielding plate, disposed on the first electromagnetic shielding plate, surrounds the testing stand. In a case, the testing stand may include a socket, or in another case, the testing stand can be an anisotropic conductive film.

Therein, the first electromagnetic shielding plate, the second electromagnetic shielding plate and the third electromagnetic shielding plate are made of metal material, superconductor material or some other electrical conductive materials. The fetching device can be movably disposed above the testing platform. The fetching device includes a third electromagnetic shielding plate. The fetching is used for placing a DUT on the testing stand. In this embodiment, the third electromagnetic shielding plate corresponds to the second electromagnetic shielding plate of the testing platform. When the fetching device places the DUT on the testing stand, the third electromagnetic shielding plate cooperates with the second electromagnetic shielding plate and the first electromagnetic shielding plate of the testing platform to form an isolated space. It utilizes the characteristic of conductor material to complete the electromagnetic shielding function for isolating the DUT.

Compared to prior art, in the testing system according to the invention, the fetching device and the testing platform respectively have the corresponding conductive covering plate and the conductive wall, which can cooperate with the conductive base plate of the testing platform to form the isolated space for isolating the DUT. Accordingly, the testing system in the invention needs not huge-sized isolating box, but it can accomplish electromagnetic shielding within a compact space. Besides, the actions of placing and electromagnetic shielding the DUT in the invention are both completed by the fetching device at the same time. That is to say, the testing method in the invention is capable of ensuring a smooth and efficiency testing procedure.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
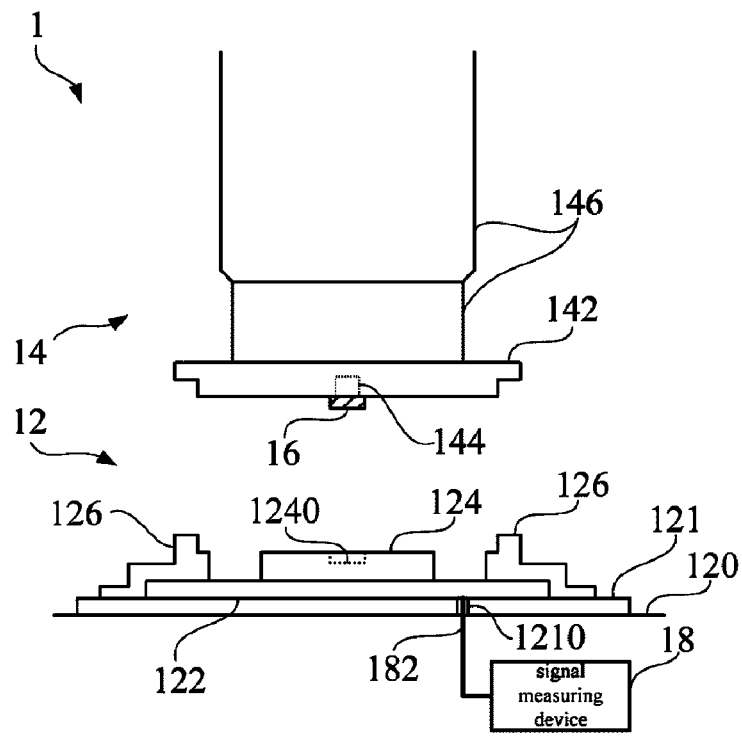
FIG. 1 is a schematic diagram illustrating a testing system according to an embodiment of the invention.

Please refer to FIG. 1. FIG. 1 is a schematic diagram illustrating a testing system 1 according to an embodiment of the invention. As shown in FIG. 1, the testing system 1 in the embodiment includes testing platform 12, fetching device 14 and signal measuring device 18. The testing system 1 is used for testing the device under test (DUT) 16.

In the embodiment, the DUT 16 can be an IC component. In another embodiment, the DUT 16 can also be an IC module. The IC module may include an IC component, a print circuit board (PCB) and some active/passive components in need. In other words, the testing system 1 in the invention can be applied in testing various electronic assemblies at component or module level.

In the embodiment, the testing platform 12 includes a base body 120, a metal base plate 121, a DUT board 122, a testing stand 124 and a metal wall 126. The metal base plate 121 is disposed on the base body 120. The DUT board 122 is disposed on the metal base plate 121. The testing stand 124 is disposed on the DUT board 121 and electrically connected to the DUT board 122. The metal wall 126 is disposed on the metal base plate 121. As shown in FIG. 1, the metal wall 126 in the embodiment covers the DUT board 122 and surrounds the testing stand 124. In the embodiment, the testing stand 124 further includes a socket 1240. The shape and size of the socket 1240 correspond to the DUT 16. The socket 1240 is used for accommodating the DUT 16.

Besides, the testing stand 124 of the invention is not limited to have a socket. In another embodiment, the testing stand 124 may be an anisotropic conductive film. The anisotropic conductive film can also be utilized as a signal transmitting medium between the DUT board 122 and the DUT 16.

As shown in FIG. 1, the metal base plate 121 may have a through hole 1210 thereon. The signal measuring device 18 of the testing system 1 may have a signal cable 182, which goes across the metal base plate 121 through the through hole 1210. The signal cable is used to form the connection between the signal measuring device 18 and the DUT board 122, such that the signal measuring device 18 can detect the signal variation on the DUT board 122.

The DUT board 122 here is implemented to match the testing demand for the DUT 16. The DUT board 122 has corresponding testing signal connecting pins (not shown). The DUT board 122 is electrically connected to the DUT 16 through the testing stand 124 and able to perform some testing operation toward the DUT 16.

To be noticed that, the materials of aforesaid metal base plate 121 and metal wall 126, in practical applications, are not limited to metal materials. In other case, the metal base plate 121 and the metal wall 126 may respectively be an electromagnetic shielding plate. The material of the electromagnetic shielding plate can be metal, superconductor or some other conductive materials.

The fetching device 14 is disposed above the testing platform 12. The fetching device 14 includes a metal covering plate 142, a fetching structure 144 and a telescopic structure 146. The fetching device 14 may move relative to the testing platform 12 by utilizing the telescopic structures 146. For example, the telescopic structure 146 in the embodiment can extend or shrink, so as to drive the fetching device 14 move vertically relative to the testing platform 12.

The fetching structure 144 of the fetching device 14 is used for clasping or drawing the DUT. The fetching structure 144 cooperates with the fetching device 14 for placing the DUT 16 into the socket 1240 on the testing stand 124.

In the embodiment, the metal covering plate 142 of the fetching device 14 corresponds to the metal wall 126 of the testing platform 12. For example, the metal covering plate 142 and the metal wall 126 in the embodiment have equivalent widths and complementary shapes (shown in FIG. 1), but the correspondence between the metal covering plate 142 and the metal wall 126 is not limited to this.

Figure 2:
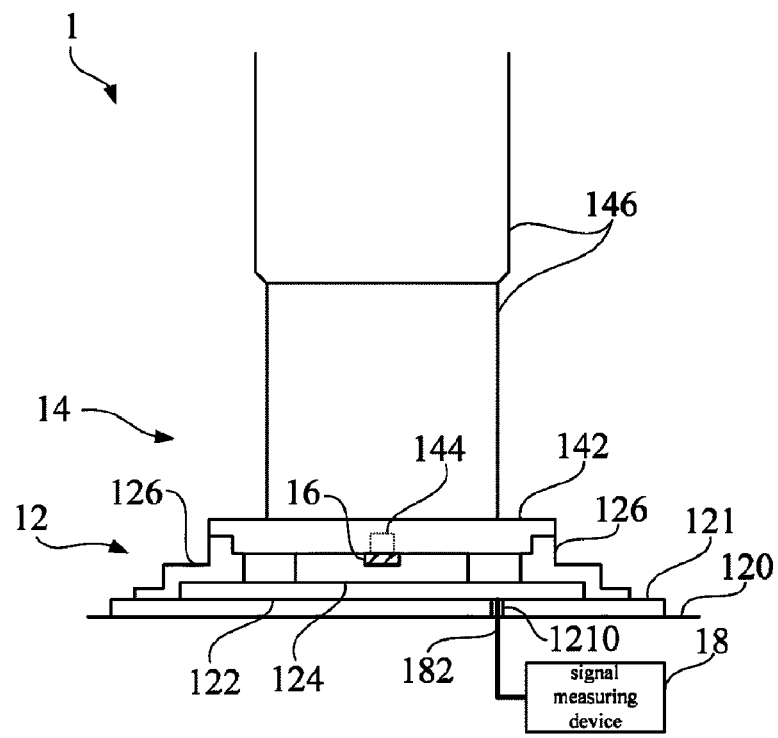
FIG. 2 is a schematic diagram illustrating that the fetching device places the DUT 16 on the testing platform.

Please refer to FIG. 2. FIG. 2 is a schematic diagram illustrating that the fetching device 14 places the DUT 16 on the testing platform 12. With the telescopic structure 146 of fetching device 14 extending downward, the fetching device 14 may place the DUT 16 on the testing platform 12.

As shown in FIG. 2, when the fetching device 14 places the DUT 16 into the socket 1240, the metal covering plate 12 cooperates with the metal wall 126 of the testing platform 12 and the metal base plate 121 to form an isolated space. It utilizes the electromagnetic shielding characteristic of metal material for isolating the DUT 16. At the same time, the DUT 16 is coupled to the DUT board 122 through the testing stand 124. Accordingly, a detail test can be performed on the DUT by the DUT board 122 and the signal measuring device 18.

In another embodiment of the invention, when the testing stand 124 is an anisotropic conductive film, the fetching device 14 places the DUT 16 onto the anisotropic conductive film.

As shown in FIG. 1, the fetching device 14 in the invention has a metal covering plate 142. Besides, the testing platform correspondingly has the metal wall 126 and the metal base plate 121. When the fetching device 14 completes the action of placing the DUT 16, the electromagnetic shielding space is formed at the same time by the metal covering plate 142, the metal wall 126 and the metal base plate 121.

Besides, the through hole 1210 of the metal base plate 121 in FIG. 1 can be designed to match the diameter of the signal cable 182, so as to avoid the interference from the through hole 1210 to the electromagnetic shielding effect. Accordingly the signal measuring device 18 can measure the signals from the DUT 16 under electromagnetic shielding condition.

In practical applications, because the testing system 1 can fulfill electromagnetic shielding, it can effectively test IC components or IC modules under low noise, and is particularly useful in testing a circuit unit with radio frequency (RF) functions. In other words, the DUT 16 can be a RFIC component or a RFIC module, and correspondingly, the signal cable for transmitting the testing signal can be a RF cable.

Figure 3:
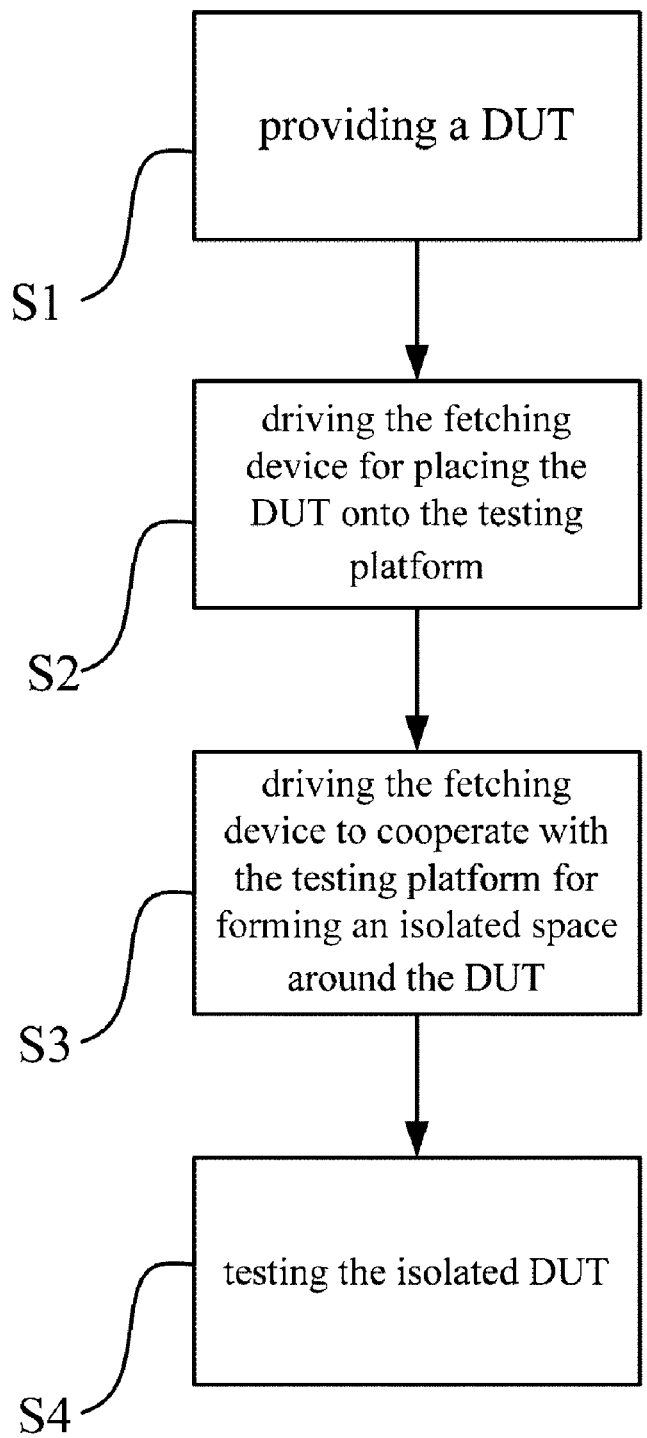
FIG. 3 is a flowchart illustrating a testing method according to another embodiment of the invention.

Please refer to FIG. 3. FIG. 3 is a flowchart illustrating a testing method according to another embodiment of the invention. The testing method is suitably applied in a testing system comprising a testing platform and a fetching device. Please refer to FIG. 1 for practical hardware implementation of the testing system. The detail components are similar to the previous descriptions in the invention, and are not repeated here.

Firstly, step S1 is executed for proving a DUT, which the DUT can be an IC component, or further be a RFIC component or a RFIC module.

Afterward, step S2 is executed for driving the fetching device for placing the DUT onto the testing platform. The testing platform here may include a metal base plate and a testing stand. The testing stand is disposed on the metal base plate and has a socket. It can place the DUT into the socket on the testing platform in step S2.

Afterward, step S3 is executed for driving the fetching device to cooperate with the testing platform to form an isolated space around the DUT. The testing platform further includes a metal wall. The metal wall is disposed on the metal base plate and surrounds the testing stand. The fetching device includes a metal covering plate. It drives the metal covering plate of the fetching device to cooperate with the metal wall and the metal base plate of the testing platform, for forming the isolating space. Finally, step S4 is executed for testing the isolated DUT.

The following paragraphs are about an experimental example for demonstrating the electromagnetic shielding effect of the testing system in the invention.

Figure 4:
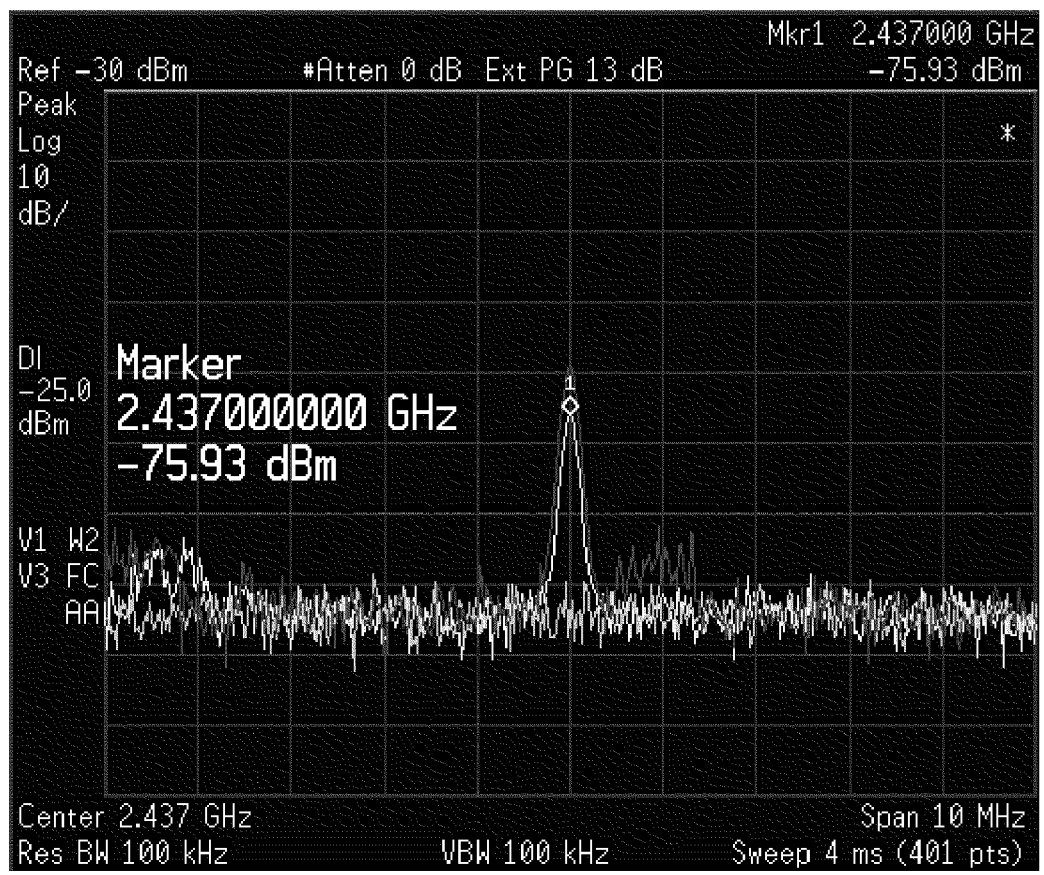
FIG. 4 is a measuring result plot of a spectrum analyzer measuring the isolated radio signal in the experimental example.

Please refer to FIG. 2 and FIG. 4. FIG. 4 is a measuring result plot of a spectrum analyzer measuring the isolated radio signal in the experimental example. In this experimental example, it utilizes a function generator (Agilent Technologies 8672A) for generating an experimental radio signal (16 dBm, 2.4 GHz). A transmitting antenna is set up in the isolated space of the testing system in FIG. 2. The experimental radio signal is transmitted through the signal cable to the transmitting antenna, and the experimental radio signal is further broadcasted by the transmitting antenna within the isolated space.

A receiving antenna (ETS-LINDGREN SN:00027183 Horn Antenna) is set up outside the isolated space. The receiving antenna is electrically connected to the spectrum analyzer (ADVANTEST R3162). The measuring result is shown in FIG. 4. The amplitude of the measured radio signal is −75.93 dBm (freq at 2.437 GHz). In conclusion, the isolating rate of the testing system in the invention can reach 91.93 dBm. (16 dBm−(−75.93 dBm)=91.93 dBm)

In conclusion, in the testing system according to the invention, the fetching device and the testing platform respectively have the corresponding conductive covering plate and the conductive wall, which can cooperate with the conductive base plate of the testing platform to form the isolated space for isolating the DUT. The isolated space can provide a shielding effect to 91.93 dBm. Accordingly, the testing system in the invention needs not huge-sized isolating box, but it can accomplish electromagnetic shielding within a compact space. Besides, the actions of placing and electromagnetic shielding the DUT in the invention are both completed by the fetching device at the same time. That is to say, the testing method in the invention is capable of ensuring a smooth and efficiency testing procedure.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A testing system, comprising:
   a testing platform comprising:
   a metal base plate;
   a DUT board disposed on the metal base plate;
   a testing stand, the testing stand being disposed on the DUT board and electrically connected to the DUT board; and
   a metal wall disposed on the metal base plate and surrounding the testing stand; and
   a fetching device movably disposed above the testing platform, the fetching device comprising a metal covering plate, the fetching being used for placing a DUT on the testing stand, the metal covering plate corresponding to the metal wall of the testing platform;
   wherein when the fetching device places the DUT on the testing stand, the metal covering plate cooperates with the metal wall and the metal base plate of the testing platform to form an isolated space, for isolating the DUT.

2. The testing system of claim 1, wherein the testing stand further comprises a socket.

3. The testing system of claim 1, wherein the testing stand is an anisotropic conductive film.

4. The testing system of claim 1, wherein the DUT is an integrated circuit component.

5. The testing system of claim 4, further comprising a signal measuring device for measuring the DUT, the signal measuring device having a signal cable, wherein the DUT is a radio frequency integrated circuit component, and the signal cable is a radio frequency signal cable.

6. The testing system of claim 1, wherein the DUT is an integrated circuit module, the integrated circuit module comprising an integrated circuit component, a printed circuit board and an active/passive component.

7. The testing system of claim 6, further comprising a signal measuring device for measuring the DUT, the signal measuring device having a signal cable, wherein the DUT is a radio frequency integrated circuit module, and the signal cable is a radio frequency signal cable.

8. The testing system of claim 1, further comprising a signal measuring device for measuring the DUT, the signal measuring device having a signal cable, wherein the metal base plate further comprises at least one through hole, and the signal cable of the signal measuring device goes across the metal base plate through the at least one through hole and connects with the DUT.

9. The testing system of claim 1, wherein the fetching device further comprises a fetching structure used for clasping or drawing the DUT and placing the DUT on the testing stand.

10. The testing system of claim 1, wherein the fetching device further comprises a telescopic structure used for driving the fetching device move vertically relative to the testing platform.

11. A testing method suitably applied in a testing system comprising a testing platform and a fetching device, the testing method comprising steps of:
   (a) proving a DUT;
   (b) driving the fetching device for placing the DUT onto the testing platform, which further comprises a metal base plate, a DUT board, and a testing stand, the DUT board disposed on the metal base plate, the testing stand disposed on the DUT board and electrically connected to the DUT board, step (b) further comprising:

(b1) placing the DUT on the testing stand of the testing platform;
(c) driving the fetching device to cooperate with the testing platform for forming an isolated space around the DUT; and
(d) testing the isolated DUT.

12. The testing method of claim 11, wherein the testing platform further comprises a metal wall, the metal wall being disposed on the metal base plate and surrounding the testing stand, the fetching device comprising a metal covering plate, wherein step (c) further comprises a step of:
(c1) utilizing the metal covering plate of the fetching device to operate with the metal wall and the metal base plate of the testing platform, for forming the isolated space.

13. A testing system, comprising:
a testing platform comprising:
a first electromagnetic shielding plate;
a DUT board disposed on the first electromagnetic shielding plate;
a testing stand, the testing stand being disposed on the DUT board and electrically connected to the DUT board; and
a second electromagnetic shielding plate disposed on the first electromagnetic shielding plate and surrounding the testing stand; and
a fetching device movably disposed above the testing platform, the fetching device comprising a third electromagnetic shielding plate, the fetching being used for placing a DUT on the testing stand, the third electromagnetic shielding plate corresponding to the second electromagnetic shielding plate of the testing platform;
wherein when the fetching device places the DUT on the testing stand, the third electromagnetic shielding plate cooperates with the second electromagnetic shielding plate and the first electromagnetic shielding plate of the testing platform to form an isolated space, for isolating the DUT.

14. The testing system of claim 13, wherein the testing stand further comprises a socket.

15. The testing system of claim 13, wherein the testing stand is an anisotropic conductive film.

16. The testing system of claim 13, wherein the first electromagnetic shielding plate, the second electromagnetic shielding plate and the third electromagnetic shielding plate are made of metal material.

17. The testing system of claim 13, wherein the first electromagnetic shielding plate, the second electromagnetic shielding plate and the third electromagnetic shielding plate are made of superconductor material.

18. The testing system of claim 13, further comprising a signal measuring device for measuring the DUT, the signal measuring device having a signal cable, wherein the first electromagnetic shielding plate further comprises at least one through hole, and the signal cable of the signal measuring device goes across the first electromagnetic shielding plate through the at least one through hole and connects with the DUT.

* * * * *